United States Patent [19]

Sakai

[11] Patent Number: 5,439,844
[45] Date of Patent: Aug. 8, 1995

[54] PROCESS FOR FORMING DEPOSITED FILM

[75] Inventor: Akira Sakai, Nagahama, Japan

[73] Assignee: Canon Kabushiki Kaisha, Tokyo, Japan

[21] Appl. No.: 60,508

[22] Filed: May 12, 1993

Related U.S. Application Data

[63] Continuation of Ser. No. 728,310, Jul. 8, 1991, abandoned, which is a continuation of Ser. No. 579,244, Sep. 6, 1990, abandoned, which is a continuation of Ser. No. 38,218, Apr. 14, 1987, abandoned.

[30] Foreign Application Priority Data

Apr. 14, 1986 [JP] Japan .................. 61-85506
Apr. 15, 1986 [JP] Japan .................. 61-86824

[51] Int. Cl.⁶ .............................................. C30B 29/12
[52] U.S. Cl. ........................ 437/83; 117/99; 117/101; 117/102; 117/935; 437/89
[58] Field of Search ............... 156/610, 611, 612, 613, 156/614, 643, DIG. 4; 117/935, 99, 101, 102; 437/83, 89

[56] References Cited

U.S. PATENT DOCUMENTS

| | | | |
|---|---|---|---|
| 4,065,369 | 12/1977 | Ogawa et al. | 204/164 |
| 4,094,722 | 6/1978 | Yamamoto et al. | 156/643 |
| 4,138,306 | 2/1979 | Niwa | 156/643 |
| 4,217,374 | 8/1980 | Ovshinsky et al. | 156/DIG. 64 |
| 4,353,777 | 10/1982 | Jacob | 156/643 |
| 4,490,208 | 12/1984 | Tanaka et al. | 156/DIG. 64 |
| 4,522,662 | 6/1985 | Bradbury et al. | 156/613 |
| 4,533,410 | 8/1985 | Ogura et al. | 156/612 |
| 4,545,851 | 10/1985 | Takeda | 156/643 |
| 4,599,135 | 7/1986 | Tsunekawa et al. | 156/643 |
| 4,716,048 | 12/1987 | Ishihara et al. | 427/39 |
| 4,717,585 | 1/1988 | Ishihara et al. | 427/53.1 |
| 4,717,586 | 1/1988 | Ishihara et al. | 427/39 |
| 4,726,963 | 2/1988 | Ishihara et al. | 427/39 |
| 4,728,528 | 3/1988 | Ishihara et al. | 427/39 |
| 4,778,692 | 10/1988 | Ishihara et al. | 427/53.1 |
| 4,784,874 | 11/1988 | Ishihara et al. | 427/49 |
| 4,801,468 | 1/1989 | Ishihara et al. | 427/35 |
| 4,818,563 | 4/1989 | Ishihara et al. | 427/55 |
| 4,835,005 | 5/1989 | Hirouka | 427/58 |
| 4,908,329 | 3/1990 | Kanai et al. | 437/5 |
| 4,908,330 | 3/1990 | Arai et al. | 437/3 |
| 4,914,052 | 4/1990 | Kanai | 437/5 |
| 4,942,058 | 7/1990 | Sano | 156/612 |

FOREIGN PATENT DOCUMENTS

| | | | |
|---|---|---|---|
| 0241311 | 10/1987 | European Pat. Off. | |
| 49-43470 | 11/1974 | Japan | 156/613 |
| 55-71695 | 5/1980 | Japan | 156/614 |

OTHER PUBLICATIONS

Runyan, "Silicon Semiconductor Technology", McGraw-Hill Book Co. New York, 1965 pp. 72 to 73.

*Primary Examiner*—Robert Kunemund
*Attorney, Agent, or Firm*—Fitzpatrick, Cella, Harper & Scinto

[57] ABSTRACT

A process for forming a deposited film comprises the steps:
(a) arranging a substrate having crystal orientability uniformly on its surface in a film forming space for formation of a deposited film;
(b) introducing into said film forming space an activated species (A) formed by decomposition of a compound (SX) containing silicon and a halogen and an activated species (B) formed from a chemical substance (B) for film formation which is chemically mutually reactive with said activated species (A) separately from each other, thus permitting both the species to react chemically with each other thereby to form a deposited film on the above substrate; and
(c) introducing into said film forming space a gaseous substance (E) having etching action on said deposited film to be formed or a gaseous substance (E2) forming said gaseous substance (E) during the above film formation step (b), thus exposing the surface for deposited film growth to said gaseous substance (E) and thereby effecting an etching action to conduct crystal growth preferentially in a specific face direction.

10 Claims, 2 Drawing Sheets

PROCESS FOR FORMING DEPOSITED FILM

This application is a continuation of application Ser. No. 07/728,310 filed Jul. 8, 1991 now abandoned, continuation of application Ser. No. 07/579,244 filed Sep. 6, 1990, now abandoned, which is a continuation of application Ser. No. 07/038,218 filed Apr. 14, 1987, now abandoned.

BACKGROUND OF THE INVENTION

1. Field of the Invention

This invention relates to a process suitable for forming a functional deposited film containing silicon, particularly a deposited film containing polycrystalline silicon to be used for semiconductor device, photosensitive device for electrophotography, line sensor for image input, image pickup device, etc.

2. Related Background Art

For example, for formation of an amorphous silicon film, the vacuum deposition method, the plasma CVD method, the CVD method, the reactive sputtering method, the ion plating method, the optical CVD method etc., have been attempted to be practiced, and, in general, the plasma CVD method has widely been used and industrialized.

However, for the deposited film constituted of amorphous silicon, there is room left for further improvement of overall characteristics with respect to electrical, optical characteristics and, fatigue characteristic or use environmental characteristic in repeated uses, further productivity and bulk productivity including uniformity and reproducibility.

Particularly, depending on the application use of the deposited film, bulk production with reproducibility must be attempted with full satisfaction of enlargement of area, uniformity of film thickness as well as uniformity of film quality and yet at high speed film formation, and therefore in formation of an amorphous silicon deposited film according to the plasma CVD method, enormous installation investment is required for bulk production equipment and also control items for such bulk production become complicated, with control tolerance being narrow and conditioning of the equipment being delicate. These are pointed out as the problems to be improved in the future.

On the other hand, in formation of a polycrystalline deposited film, the normal pressure CVD method or the LPCVD method have been employed, but these methods require high temperature and therefore substrate materials are limited to those having high melting points. On the other hand, due to difficulties in control of crystal grain size, compensating for the defects existing at the grain boundaries or orienting regularly the crystal faces, there have been pointed out problems such that no practically useful characteristic can be obtained, that enlargement of area is difficult, that no uniform film thickness or film quality can be obtained and that reproducibility is poor.

Also, in the plasma CVD method, although substrate temperature can be made lower as compared with the normal pressure CVD method or the LPCVD method, on the other hand, the structure of the reaction device is limited for formation of stable plasma, and besides a large number of other parameters (gas species introduced, gas flow rates, pressure, high frequency power, evacuation speed, etc.) also exist, which have respectively great influences on plasma. Accordingly, plasma will be delicately varied by slight changes in these parameters or their combinations, whereby bad influences were frequently exerted on uniformly or electrical and optical characteristics of the deposited film. Further, the damage by collision of electrons or ions existing in plasma against the deposited film is also great, which is one of the factors deteriorating film characteristics.

As described above, under the present situation, in both of amorphous silicon films and polycrystalline silicon films, problems attributable to their forming methods exist. Particularly, in aspects of improvement of electrical characteristic of deposited film as well as stability, it has been desired in formation of a polycrystalline silicon film to develop a method for forming a polycrystalline silicon film with large area at low cost while maintaining its practically useful characteristics, uniformity and stability.

SUMMARY OF THE INVENTION

The present invention removes the drawbacks of the normal pressure CVD method, the LPCVD method, the plasma CVD method as described above, and yet provides a novel method for forming a polycrystalline deposited film without use of the forming method of the prior art.

An object of the present invention is to provide a process for forming a polycrystalline deposited film which is suitable for enlargement of the film and can easily accomplish improvement of productivity and bulk production of the film, while attempting to improve various characteristics of the polycrystalline film formed, the film forming speed and reproducibility and also to uniformize film quality.

The present invention for accomplishing the above object is process for forming a deposited film, which comprises introducing into a deposition space for formation of a deposited film on a substrate an activated species (A) formed by decomposition of a compound containing silicon and a halogen and an activated species (B) formed from a chemical substance for film formation which is chemically mutually reactive with said activated species (A) separately from each other, permitting both the species to react chemically with each other thereby to form a deposited film on the above substrate, characterized in that a substrate having a crystal orientable surface is used as said substrate, and crystal growth in a specific face direction is preferentially effected by feeding a gaseous substance (E) having etching action on said deposited film to a growth surface of the deposited film during formation of said deposited film to thereby apply etching action on the surface of said deposited film.

DESCRIPTION OF THE PREFERRED EMBODIMENT

In the present invention, the activated species (A) from the activation space (A) should preferably be selected and used as desired from those having the life of 0.1 sec. or longer, more preferably 1 sec. or longer, optimally 10 sec. or longer, from the standpoint of productivity and easiness in handling, and the constituent elements of the active species (A) become the components constituting the deposited film formed in the film forming space. Also, the chemical substance (B) for film formation is activated by the action of an activation energy in the activation space (B) before introduction into the film forming space to undergo chemical mutual reaction with the active species (A) introduced from the activation space (A) at the same time during formation of the deposited film and containing constituent elements which become the constituent components of the deposited film formed. As the result, a deposited film is easily formed on a desired substrate.

In the present invention, as the compound (SX) containing silicon and halogen to be introduced into the activation space (A) there may be employed, for example, chain or cyclic silane compounds of which hydrogen atoms are partially or wholly substituted with halogen atoms, specifically chain silicon halides represented by $Si_u Y_{2u+2}$ (u is an integer of 1 or more, Y is at least one element selected from F, Cl, Br and I) and cyclic silicon halides $Si_v Y_{2v}$ (v is an integer of 3 or more, and Y has the same meaning as defined above), chain and cyclic compounds represented by $Si_u H_x Y_y$ (u and Y have the same meanings as defined above, $x+y=2u$ or $2u+2$). Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_3Cl$, $SiH_2Cl_2$, $SiHBr_3$, $SiHI_3$, $Si_2Cl_3F_3$, and the like.

For formation of the activated species (A), in addition to the above compound (SX) containing silicon and halogen, simple substance of silicon, other silicon compounds, hydrogen, a halogen compound (e.g., $F_2$ gas, $Cl_2$ gas, gasified $Br_2$, $I_2$, etc.) and the like can be used in combination, if desired.

In the present invention, as the method for forming activated species (A) in the activation space (A), there may be employed various activation energies such as electrical energies including microwave, RF, low frequency, DC, etc., heat energies such as heater heating, IR-ray heating, etc., light energy, etc. in view of respective conditions and devices.

By application of excitation energy such as heat, light and electricity on the compounds as described above in an activation space (A), the activated species (A) can be formed.

As the above chemical substance (B) for film formation for forming active species (B) in the activation space (B) to be used in the process of the present invention, hydrogen gas and/or a halogen gas (e.g. $F_2$ gas, $Cl_2$ gas, gasified $Br_2$, $I_2$, etc.) may be advantageously used. Also, in addition to these chemical substances (B) for film formation, for example, an inert gas such as helium, argon, neon, etc., may be also employed. When a plural number of these chemical substances (B) for film formation are employed, they can be previously mixed and introduced under gaseous state into the activation space (B), or alternatively these chemical substances (B) for film formation may be fed individually from the respective independent feeding sources, or they can be introduced into the respective independent activation spaces to be individually activated.

In the present invention, the proportion in amount of the above activated species (A) to the activated species (B) to be introduced into the film forming space may suitably be determined depending on the depositing conditions, the kind of the activated species, etc., but may preferably be 10:1 to 1:10 (introduction flow rate ratio), more preferably 8:2 to 4:6.

Further, in the process of the present invention, etching action is applied to the growth surface of deposited film at the same time or substantially at the same time as film formation. That is, a gaseous substance (E) having originally etching activity is introduced, or alternatively a gaseous substance (E2) having potentially etching activity is decomposed with electrical energy, heat energy, optical energy, etc., to form a gaseous substance (E) to effect the surface of the deposited film which is being formed on the substrate by the gaseous substance (E). At this time, the etching rate for the polycrystalline silicon deposited film differs depending on the crystal face, and it is possible to grow preferentially crystal having oriented face corresponding to the orientability of the substrate surface by selecting suitably the gas species, flow rates (ratio), substrate temperature, etc., during formation of deposited film.

In the present invention, an etching action is applied to a growth surface of the deposited film, as mentioned above. In the present invention, during the film forming step, that is (a) during film formation etching action is applied on the growth surface of deposited film at the same time, or (b) etching action is applied on the growth surface of deposited film with intermission of film formation, whereby crystal growth can be effected preferentially in a specific face direction to give a deposited film with good crystallinity. The etching action in the case of the above (b) may be effected within the film forming space or alternatively in an etching space separate from the film forming space.

As the gaseous or readily gasifiable substance for etching (E) having etching action on the deposited film containing silicon, there may be included simple substances of halogen, halogen compounds or activated species (C) formed from these.

These substances (E) for etching may be introduced under gaseous state into the space where etching action is applied, or alternatively in the case when the substance (E) is formed by the surface reaction on the surface of the deposited film of the above activated species (A) or the above activated species (B) or formed from the chemical reaction between the activated species (A) and the activated species (B), etching action is applied on the growth surface of the deposited film simultaneously with film formation.

For example, as an example in which the substance for etching (E) is formed by the above surface reaction, the reaction between an activated species of halogen and hydrogen or a halogen and activated species of hydrogen occurs on the growth surface of the deposited film, and hydrogen halide (HX) is released from the growth surface of the deposited film and the hydrogen halide becomes the substance (E) for etching.

As the gaseous substance (E) having etching action in the present invention, there may be employed halogens such as $F_2$, $Cl_2$, gasified $Br_2$, $I_2$, etc., halogenated carbons such as $CHF_3$, $CF_4$, $C_2F_6$, $CCl_4$, $CBrF_3$, $CCl_2F_2$, $CCl_3F$, $CClF_3$, $C_2Cl_2F_4$, etc., halides including typically boron halides such as $BCl_3$ and $BF_3$, $SF_6$, $NF_3$, $PF_5$, etc., and further radicals such as $F^*$, $Cl^*$, ions such as $CF_3^+$, $CCl_3^+$, from these gases. These can be used also as mixtures, and the etching characteristics can be controlled by adding $O_2$, $H_2$ and other gases in amounts which do not affect the film.

As the method for etching with these substances (E), etching and film formation may be repeated alternately by providing separately an etching space, or the substance (E) can be introduced under the state having etching activity into the film forming space to effect etching action simultaneously with film formation, thereby giving the effect of limiting the growth direction of the crystalline film to accomplish the object of the present invention.

During the crystal growth of silicon or a material containing silicon, the growth rate depends on face orientation. This may differ depending on the process for the preparation of deposited film or deposition conditions, but in the process of the present invention, particularly (1,1,0), (1,1,1) and (1,0,0) are preponderant. Under the conditions by selecting suitably the kind of substance (E) for etching and etching conditions, the condition for depositing a polycrystalline crystal having stronger orientability can be realized. That is, it becomes to possible to form a polycrystalline silicon deposited film haing large grain size oriented by depending upon the orientation of the substrate surface.

As the substrate material having crystal orientability which is used in the present invention is required to satisfy the following conditions for crystal growth on a substrate of a different substance, namely:

1. the lattice constant of the crystal material on the substrate surface should be coincident with or extremely approximate to the lattice constant of the deposited film;
2. coefficient of thermal expansion of the crystal material of the substrate surface should be coincident with or extremely approximate to that of the deposited film.

Hence, particularly for obtaining a deposited film of crystalline Si, as the appropriate material which should constitute the surface of the substrate there may be included $CaF_2$, ZnS, Yb, $Mn_3Ga$, $NaCoF_3$, $Ni_3Sn$, $Fe_3C$, $NiTe_x$ (x<0.7) $CoMnO_3$, $NiMnO_3$, $MaZn_3$, CuCl, AlP, Si, etc. Even when the above two conditions are not satisfied, a crystalline deposited film can be obtained by selecting adequately the deposition conditions, and therefore the material is not limited to those as described above.

The deposited film formed according to the present invention can be doped with an impurity element during or after film formation. As the impurity element to be used, there may be employed, as p-type impurity, an element belonging to the group IIIA of the periodic table such as B, Al, Ga, In, Tl, etc. and, as n-type purity, an element belonging to the group VA of the periodic table such as N, P, As, Sb, Bi, etc. as suitable ones. Particularly, B, Ga, P and Sb are most preferred. The amount of the impurity to be doped may be determined suitably depending on the desired electrical and optical characteristics.

As the substance containing such an impurity atom as the component (substance for introduction of impurity), it is preferable to select a compound which is gaseous under normal temperature and normal pressure, or gaseous at least under the conditions for formation of deposited film and can be readily gasified by a suitable fasifying device. Such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds.

The substances for introduction of impurities may be directly introduced under gaseous state into the film forming space, or alternatively activated previously in the activation space (A) or the activation space (B) or a third activation space (C) before introduction into the film forming space.

Next, by referring to the drawings, an example of the process for forming deposited film of the present invention in the case of depositing a polycrystalline silicon film is described in detail.

Figure 1:
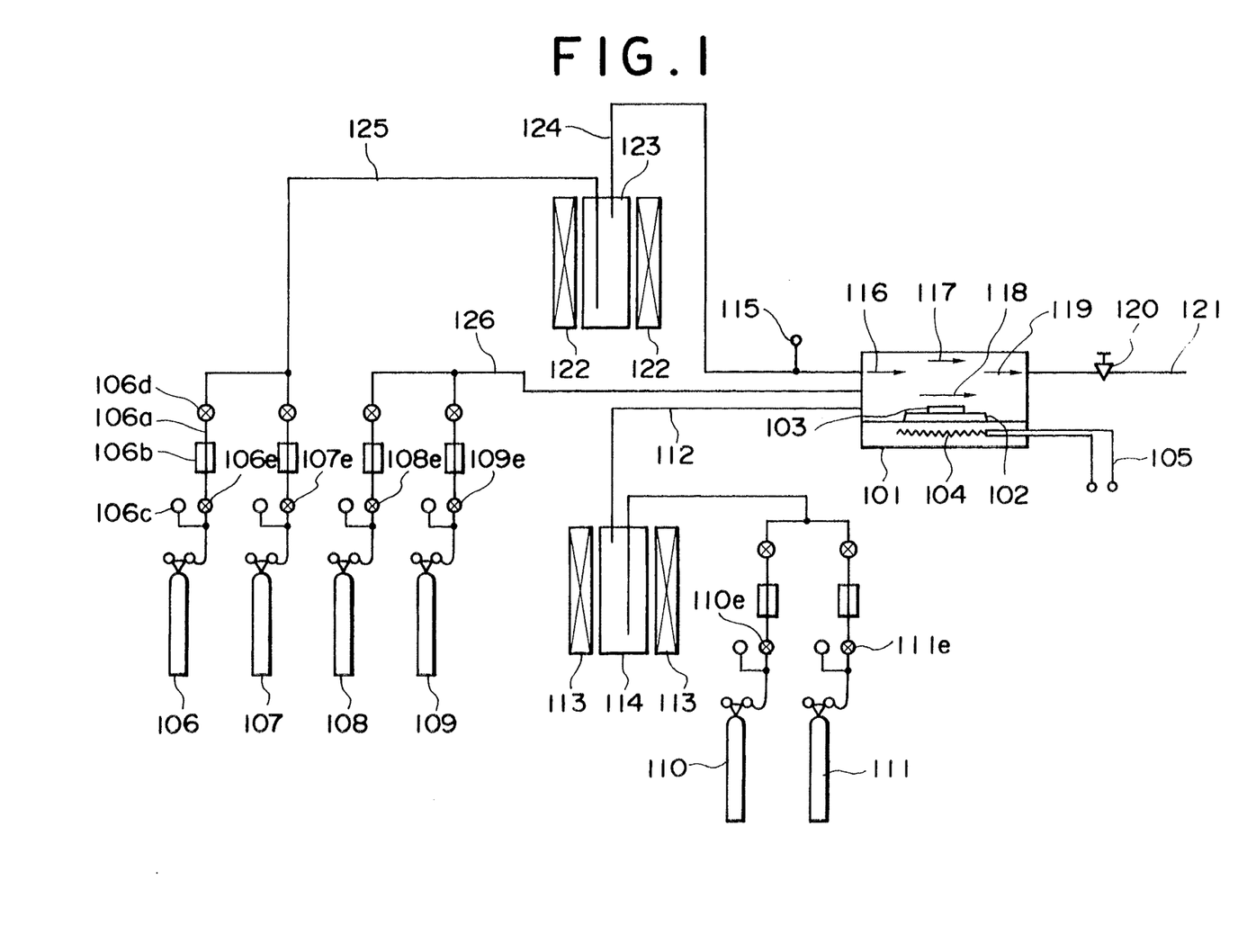
FIG. 1 is a schematic diagram illustrating a preferred constitution of the film formation apparatus realizing the process of the present invention.

FIG. 1 is a schematic diagram showing schematic construction of an example of the apparatus for forming deposited film in which the process of the present invention is practiced.

In FIG. 1, 101 is a deposition chamber in which polycrystalline silicon film is deposited therein, and the deposition chamber 101 is internally connected to an evacuation system not shown through an evacuation pipe 121, whereby the deposition chamber 101 can be internally held at a desired pressure through an evacuation valve 120. The pressure in the deposition chamber 101 is controlled to ordinarily at $10^{-5}$ Torr to 1.0 Torr, preferably at $10^{-4}$ Torr to 0.1 Torr. In the deposition chamber 101, a desired substrate 103 is placed on the substrate supporting stand 102.

104 is a heater for heating the substrate, and electricity is supplied through a conductive wire 105 to genearte heat. The substrate temperataure is not particularly limited, but it should preferably 100° to 500° C., more preferably 150° to 400° C., in practicing the process of the present invention.

106 through 111 are gas feeding sources, and provided corresponding to the number of silicon compounds and hydrogen, halogen compound, inert gases, compounds containing impurity elements as the component which may be optionally employed. When liquid compounds of the starting material compounds are used, an appropriate gasifying device is provided. In the drawing, the symbols of the gas feeding sources 106 through 111 affixed with a show branched pipes, those affixed with b are flow meters, those affixed with c are pressure gauges for measuring the pressures on the higher pressure side, those affixed with d or e are valves for controlling the respective gas flow rates. 112,125 and 126 are gas introducing pipes into the film forming space.

Also, 114 and 123 are activation sapces for forming activated species (A) and activated species (B), respectively, and 113 and 122 are each microwave plasma generating device for formation of activated species.

116,117,118 and 119 show flows of active species (A) and active species (B) or substances formed by the chemical reaction of these.

Further, in the present invention, the above etching effect on the film growth surface can be promoted by light energy irradiation which gives rise to etching selectivity. Thus, a gaseous substance (E) for etching is optically excited to increase etching activity, which can make crystal growth in a specific direction more efficient. It is desirable that this light energy irradiation is selected so as to act more efficiently on the gaseous substance (E) for etching than on the film forming starting gas.

Another example of the process for forming deposited film of the present invention which is used in such case is described below.

Figure 2:
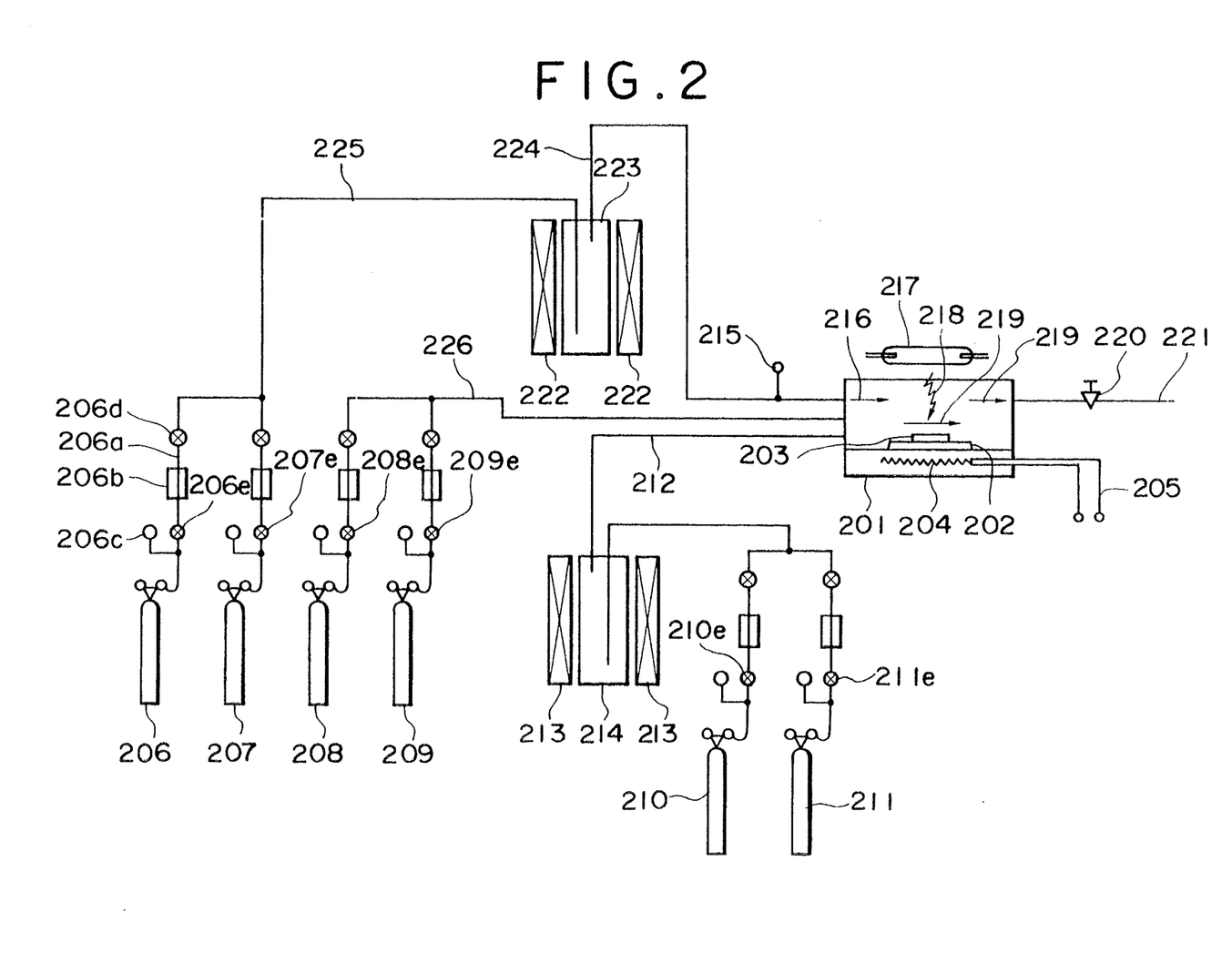
FIG. 2 is a schematic diagram illustrating another preferred constitution of the film forming apparatus realizing the process of the present invention.

FIG. 2 is a schematic diagram showing schematic construction of another example of the apparatus for forming deposited film in which the process of the present invention is practiced. In FIG. 2, the same as those in FIG. 1 are represented by same numbers.

In FIG. 2, 201 is a deposition chamber in which polycrystalline silicon film is deposited therein, and the deposition chamber 201 is internally connected to an evacuation system not shown through an evacuation pipe 221, whereby the deposition chamber 201 can be internally held at a desired pressure through an evacuation valve 120. The pressure in the deposition chamber 201 is controlled to ordinarily at $10^{-5}$ Torr to 1.0 Torr, preferably at $10^{-4}$ Torr to 0.1 Torr. In the deposition chamber 201, a desired substrate 203 is placed on the substrate supporting stand 202.

204 is a heater for heating the substrate, and electricity is supplied through a conductive wire 205 to generate heat. The substrate temperature is not particularly limited, but it should preferably 100° to 500° C., more preferably 150° to 400° C., in practicing the process of the present invention.

206 through 211 are gas feeding sources, and provided corresponding to the number of silicon compounds and hydrogen, halogen compound, inert gases, compounds containing impurity elements as the component which may be optionally employed. When liquid compounds of the starting material compounds are used, an appropriate gasifying device is provided. In the drawing, the symbols of the gas feeding sources 206 through 111 affixed with a show branched pipes, those affixed with b are flow meters, those affixed with c are pressure gauges for measuring the pressures on the higher pressure side, those affixed with d or e are valves for controlling the respective gas flow rates. 212, 225 and 226 are gas introducing pipes into the film forming space.

217 is a light energy generating device, and for example, mercury lamp, xenon lamp, carbon dioxide laser, argon ion laser, excimer laser, etc., may be employed.

The light 218 directed from the light energy generating device 217 by use of a suitable optical system toward the whole of the substrate or a desired portion of the substrate is irradiated on the starting gas, etc., flowing in the direction of the arrowhead 219 to excite the gases, etc., of the film forming starting material and effect the reaction, thereby forming a deposited film of A-Si on the whole or a desired portion of the substrate 203.

Also, 214 and 223 are activation spaces for forming activated species (A) and activated species (B), respectively, and 213 and 222 are each microwave plasma generating device for formation of activated species.

As described above in detail, according to the present invention, the CVD method can be made more stable by controlling freely the atmosphere temperature and the substrate temperature in the film forming space as desired.

The present invention uses activated species which are previously activated in a space different from the deposition space (hereinafter referred to as activation space). Therefore, the film forming speed can be dramatically increased, and also the substrate temperature can be lowered to a great extent, whereby deposited films with stable film quality can be provided industrially in large amount and yet at low cost.

According to the present invention, it has become possible to form a polycrystalline deposited film having preferentially a specific face direction of crystal due to the etching effect, on the film growth surface, of the gaseous substance (E) having etching activity or latent etching activity introduced from outside or decomposed product thereof simultaneously with formation of deposited film.

The present invention is described in more detail below by referring to Examples by which the present invention is not limited at all.

EXAMPLE 1

By means of the device shown in FIG. 1, using a 4 cm × 4 cm $CaF_2$ single crystal (the surface for forming deposited film being oriented in (110)) as the substrate, a polycrystalline silicon film was formed on said substrate as follows. That is, said substrate 103 was placed on a supporting stand 102, and the deposition chamber 101 was internally evacuated by means of an evacuation device (not shown) to be reduced in pressure to about $10^{-6}$ Torr. $H_2$ gas was introduced from the bomb 106 for gas feeding at 45 sccm through the gas introducing pipe 125 into the activation chamber (B) 123. $H_2$ gas, etc., introduced into the activation chamber (B) 123 was activated by the microwave plasma generating device 122 to form active hydrogen, and the active hydrogen was introduced through the introducing pipe 124 into the film forming chamber 101. 115 is a gas pressure gauge.

On the other hand, $SiF_4$ gas from the bomb 110 was introduced at 25 sccm through the gas introducing pipe 112 into the activation chamber (A) 114. The SiF gas introduced into the activation chamber (A) 114 was activated by means of the microwave plasma generating device 113 and the active species (A) such as $SiF_2^*$ originated from $SiF_4$ was formed then introduced through the introducing pipe 112 into the film forming chamber 101. Further simultaneously, $F_2$ gas from the bomb 108 was introduced as the etching gas at 15 sccm through the gas introducing pipe 126 into the film forming chamber 101.

While the pressure in the film forming chamber 101 under the above condition was maintained at 0.02 Torr to conduct film formation, the substrate 103 was previously heated to 350° C. by the heater 104 and maintained at this temperature. By effecting etching of the surface for growth of polycrystalline silicon film during the above film forming step by utilizing the etching action of $F_2$ gas upon film deposition, a polycrystalline silicon film with orientation in a specific direction was preferantially formed. In this step, the difference in etching speed depending on the crystal face was (1, 0, 0)>(1, 1, 1)>(1, 1, 0), whereby a polycrystalline silicon film having (1, 1, 0) face as the main crystal face was formed (Sample No. 1A). This was confirmed as follows. That is, when the deposited film formed was evaluated by X-ray diffraction, the peak intensity at the crystal angle (2θ) of 47.3 degree reflecting the (1, 1, 0) face exhibited a value which was 500 to ∞ times the peak intensity at the crystal angles (2θ) 28.4 degree and 69.2 degree reflecting respectively the (1, 1, 1) face and (1, 0, 0) face. Further, the crystal grain size was observed by a transmission type electron microscope to be uniformly 1.3 μm.

Also, when the above deposited film was analyzed by FT-IR, a weak peak was recognized in the vicinity of 2000 $cm^{-1}$, and hydrogen content was found to be 0.2 atomic %.

The film forming conditions as described above and the results of evaluation of the deposited films are shown in Table 1A and Table 2A, respectively.

EXAMPLE 2

By varying the gas species for film formation and the flow rates thereof as shown in Table 3A, and introducing an etching gas separately through a gas intorducing pipe 126, films were formed otherwise under the conditions equal to those in Example 1. The evaluation results are shown in Table 4A.

EXAMPLE 3

When films were prepared under the preparation conditions shown in Table 5 and otherwise as in Example 1 by use of a 4 cm×3 cm ZnS single crystal substrate (the surface for forming deposited film being oriented in (110)) polycrystalline silicon films of good quality shown in Table 6A were formed.

EXAMPLE 4

By use of ZnS single crystal having a face of (110) orientation and ZnS single crystal having a face of (111) orientation as the substrates, polycrystalline silicon films of good quality were formed. The preparation conditions thereupon and various characteristics are summarized in Tables 7A, 8A, 9A and 10A.

EXAMPLE 5

By means of the device shown in FIG. 2, using a 4 cm×4 cm $CaF_2$ single crystal (the surface for forming deposited film being oriented in (110)) the substrate, a polycrystalline silicon film was formed on said substrate as follows. That is, said substrate 203 was placed on a supporting stand 202, and the deposition chamber 201 was internally evacuated by means of an evacuation device (not shown) to be reduced in pressure to about $10^{-6}$ Torr. $H_2$ gas was introduced from the bomb 106 for gas feeding at 45 sccm through the gas introducing pipe 225 into the activation chamber (B) 123. $H_2$ gas, etc., introduced into the activation chamber (B) 223 was activated by the microwave plasma generating device 222 to form active hydrogen, and the active hydrogen was introduced through the introducing pipe 224 into the film forming chamber 101. 215 is a gas pressure gauge.

On the other hand, $SiF_4$ gas from the bomb 210 was introduced at 20 sccm through the gas introducing pipe 212 into the activation chamber (A) 214. The $SiF_4$ gas introduced into the activation chamber (A) 214 was activated by means of the microwave plasma generating device 213 and the activated species (A) such as $SiF_2^*$ thus formed was introduced through the introducing pipe 212 into the film forming chamber 201. Further simultaneously, $F_2$ gas from the bomb 208 was introduced as the etching gas at 12 sccm through the gas introducing pipe 226 into the film forming chamber 101.

While the pressure in the film forming chamber 201 under the above condition was maintained at 0.02 Torr, the light 218 from the 1 KW Xe lamp 217 was irradiated vertically onto the substrate 203 previously heated to 280° C. by the heater 204 to deposit a polycrystalline silicon film on the $CaF_2$ single crystal substrate and at the same time form F* by activation of $F_2$ gas by the above mentioned light irradiation, thereby effecting etching of the surface for growth of polycrystalline silicon film by utilizing the etching action of $F_2$ gas upon film deposition to form preferentially a polycrystalline silicon film with orientation in a specific direction. In this step, the difference in etching speed depending on the crystal face was (1, 0, 0)>(1, 1, 1)>(1, 1, 0), whereby a polycrystalline silicon film having (1, 1, 0) face as the main crystal face was formed (Sample No. 1B). This was confirmed as follows. That is, when the deposited film formed was evaluated by X-ray diffraction, the peak intensity at the crystal angle (2θ) of 47.3 degree reflecting the (1, 1, 0) face exhibited a value which was 700 to ∞ times the peak intensity at the crystal angles (2θ) 28.4 degree and 69.2 degree reflecting respectively the (1, 1, 1) face and (1, 0, 0) face. Further, the crystal grain size was observed by a transmission type electron microscope to be 1.5 μm.

Also, when the above deposited film was analyzed by FT-IR, a weak peak was recognized in the vicinity of 2000 $cm^{-1}$, and hydrogen content was found to be 0.19 atomic %.

The film forming conditions as described above and the results of evaluation of the deposited films are shown in Table 1B and Table 2B, respectively.

EXAMPLE 6

Films were formed under the same conditions as in Example 5 except for varying the gas species for film formation and the flow rates thereof as shown in Table 3B. The evaluation results are shown in Table 4B.

EXAMPLE 7

When films were prepared under the preparation conditions shown in Table 5B and otherwise as in Example 5 by use of a 4 cm×3 cm ZnS single crystal substrate (the surface for forming deposited film being oriented in (110)), polycrystalline silicon films of good quality shown in Table 6B were formed.

EXAMPLE 8

By use of ZnS single crystal having (100) orientation and ZnS single crystal having (111) orientation as the substrates, polycrystalline silicon films of good quality were formed. The preparation conditions thereupon and various characteristics are summarized in Tables 7B, 8B, 9B and 10B.

TABLE 1A

| | Substrate: $CaF_2$ single crystal (110) oriented | | | | | |
|---|---|---|---|---|---|---|
| | Gas species | Flow rate (SCCM) | Discharging power (W) | Substrate temperature (°C.) | Inner pressure (Torr) | Film forming (Å/S) |
| Activation space (A) | $SiF_4$ | 25 | 500 | 350 | 0.03 | 1.7 |
| | $F_2$ | 10 | | | | |
| Activation space (B) | $H_2$ | 45 | 200 | | | |
| Etching gas | $F_2$ | 15 | | | | |

TABLE 1A-continued

Substrate: CaF$_2$ single crystal (110) oriented

| | Gas species | Flow rate (SCCM) | Discharging power (W) | Substrate temperature (°C.) | Inner pressure (Torr) | Film forming (Å/S) |
|---|---|---|---|---|---|---|
| condition | | | | | | |

TABLE 2A

| Sample No. | X-ray diffraction (220)/(1,1,1) | X-ray diffraction (220)/(4,0,0) | Crystal grain size (μm) | H content (atomic %) |
|---|---|---|---|---|
| Example 1 | 1500 | 2000 | 1.3 | 0.2 |

* In Table 2, (220)/(1,1,1) and (220)/(4,0,0) are peak intensity ratios reflecting the respective crystal faces by X-ray diffraction and I/I$_0$ of ASTM card.

TABLE 3A

Substrate: CaF$_2$ single crystal (110) oriented

| | | 2-1 | 2-2 | 2-3 | 2-4 | 2-5 | 2-6 |
|---|---|---|---|---|---|---|---|
| Activation (A) | Gas species | Si$_2$F$_6$ | SiH$_2$F$_2$ | SiCl$_4$ | SiH$_2$Cl$_2$ | SiF$_4$ Ar | SiF$_4$ |
| | Flow rate (SCCM) | 10 | 20 | 20 | 20 | 20 50 | 20 |
| Activation (B) | Gas species | H$_2$ | H$_2$ | H$_2$ | H$_2$ | H$_2$ Ar | H$_2$ |
| | Flow rate (SCCM) | 45 | 37 | 46 | 27 | 46 50 | 47 |
| Etching condition | Gas species | F$_2$ | F$_2$ | Cl$_2$ | Cl$_2$ | F$_2$ | Cl$_2$ |
| | Flow rate (SCCM) | 10 | 10 | 15 | 15 | 10 | 10 |

TABLE 4A

| Sample No. | X-ray diffraction (2,2,0)/(1,1,1) | X-ray diffraction (2,2,0)/(4,0,0) | Crystal grain size (μm) | H content (atomic %) |
|---|---|---|---|---|
| 2-1 | 600 | 900 | 1.0 | 0.4 |
| 2-2 | 600 | 700 | 0.8 | 0.5 |
| 2-3 | 500 | 600 | 0.9 | 0.6 |
| 2-4 | 600 | 700 | 1.0 | 0.6 |
| 2-5 | 700 | 700 | 0.8 | 0.6 |
| 2-6 | 600 | 700 | 0.8 | 0.7 |

TABLE 5A

Substrate: ZnS single crystal (110) oriented

| | Gas species | Flow rate (SCCM) | Discharging power (W) | Substrate temperature (°C.) | Inner pressure (Torr) |
|---|---|---|---|---|---|
| Activation space (A) | SiF$_4$ | 20 | 500 | 350 | 0.02 |
| Activation space (B) | H$_2$ | 40 | 180 | | |
| Etching gas condition | F$_2$ | 7 | | | |

TABLE 6A

| X-ray diffraction (220)/(111) | X-ray diffraction (220)/(100) | Crystal grain size (μm) | H content (atomic %) |
|---|---|---|---|
| 6000 | 900 | 1.3 | 0.19 |

* In Table 6, (220)/(111) and (220)/(100) are peak intensity ratios reflecting the respective crystal face by X-ray diffraction and I/I$_0$ of ASTM card.

TABLE 7A substrate: (100) oriented ZnS single crystal

| | Gas species | Flow rate (SCCM) | Discharging power (W) | Substrate temperature (°C.) | Inner pressure (Torr) |
|---|---|---|---|---|---|
| Activation space (A) | SiF$_4$ | 20 | 500 | 350 | 0.02 |
| Activation space (B) | H$_2$ | 44 | 190 | | |
| Etching gas condition | F$_2$ | 7 | | | |

TABLE 8A

| X-ray diffraction | | Crystal grain size (μm) | H content (atomic %) |
|---|---|---|---|
| (400)/(220) | (400)/(111) | | |
| 900 | 600 | 1.5 | 0.19 |

* In Table 8, (400)/(200) and (400)/(111) are peak intensity ratios reflecting the respective crystal faces by X-ray diffraction and I/I$_0$ of ASTM card.

TABLE 9A

Substrate: (111) oriented ZnS single crystal

| | Gas species | Flow rate (SCCM) | Discharging power (W) | Substrate temperature (°C.) | Inner pressure (Torr) |
|---|---|---|---|---|---|
| Activation space (A) | SiF$_4$ | 20 | 500 | 350 | 0.015 |
| | F$_2$ | 10 | | | |
| Activation space (B) | H$_2$ | 46 | 190 | | |

TABLE 10A

| X-ray diffraction | | Crystal grain size (μm) | H content (atomic %) |
|---|---|---|---|
| (111)/(220) | (111)/(400) | | |
| 400 | 500 | 0.7 | 0.35 |

* In Table 10, (111)/(220) and (111)/(400) are peak intensity ratios reflecting the respective crystal faces by X-ray diffraction and I/I$_0$ of ASTM card.

TABLE 1B

| | Gas species | Flow rate (SCCM) | Discharging power (W) | Substrate temperature (°C.) | Inner pressure (Torr) | Light source | Film Forming rate (Å/S) |
|---|---|---|---|---|---|---|---|
| Activation space (A) | SiF$_4$ | 20 | 500 | 280 | 0.02 | Xe lamp 1 KW | 1.5 |
| Activation space (B) | H$_2$ | 50 | 200 | | | | |
| Etching conditions | F$_2$ | 12 | | | | | |

TABLE 2B

| | X-ray diffraction | | Crystal grain size (μm) | H content (atomic %) |
|---|---|---|---|---|
| | (220)/(111) | (220)/(400) | | |
| Example 1 | 1700 | 2500 | 1.5 | 0.19 |

* In Table 2, (2,2,0)/(1,1,1) and (220)/(400) are peak intensity ratios reflecting the respective crystal faces by X-ray diffraction and I/I$_0$ of ASTM card.

TABLE 3B

| Sample No. | | 2-1 | 2-2 | 2-3 | 2-4 | 2-5 | | 2-6 |
|---|---|---|---|---|---|---|---|---|
| Activation space (A) | Gas species | Si$_2$F$_6$ | SiH$_2$F$_2$ | SiCl$_4$ | SiH$_2$Cl$_2$ | SiF$_4$ | Ar | SiF$_4$ |
| | flow rate (SCCM) | 10 | 20 | 20 | 20 | 20 | 50 | 20 |
| Activation space (B) | Gas species | H$_2$ | H$_2$ | H$_2$ | H$_2$ | H$_2$ | Ar | H$_2$ |
| | flow rate (SCCM) | 50 | 30 | 50 | 30 | 50 | 50 | 50 |
| Etching condition | Gas species | F$_2$ | F$_2$ | F$_2$ | F$_2$ | F$_2$ | | Cl$_2$ |
| | flow rate (SCCM) | 12 | 12 | 12 | 13 | 13 | | 11 |

TABLE 4B

| Sample No. | X-ray diffraction | | Crystal grain size (μm) | H content (atomic %) |
|---|---|---|---|---|
| | (2,2,0)/(1,1,1) | (2,2,0)/(4,0,0) | | |
| 2-1 | 700 | 1000 | 1.1 | 0.4 |
| 2-2 | 700 | 900 | 1.0 | 0.5 |
| 2-3 | 600 | 800 | 0.9 | 0.6 |
| 2-4 | 700 | 900 | 1.0 | 0.5 |
| 2-5 | 800 | 800 | 0.9 | 0.6 |
| 2-6 | 600 | 800 | 0.9 | 0.6 |

TABLE 5B

| | Gas species | Flow rate (SCCM) | Discharging power (W) | Substrate temperature (°C.) | Inner pressure (Torr) | Light source | Film Forming rate (Å/S) |
|---|---|---|---|---|---|---|---|
| Activation space (A) | SiF$_4$ | 20 | 500 | 320 | 0.02 | Xe lamp 1 KW | 2.2 |
| Activation space (B) | H$_2$ | 50 | 200 | | | | |
| Etching conditions | F$_2$ | 13 | | | | | |

TABLE 6B

| | X-ray diffraction | | Crystal grain size | H content |
|---|---|---|---|---|
| | (220)/(111) | (220)/(400) | (μm) | (atomic %) |
| Example 3 | 7000 | 10000 | 1.4 | 0.2 |

* In Table 6B, (2,2,0)/(1,1,1) and (220)/(4,0,0) are peak intensity ratios reflecting the respective crystal faces by X-ray diffraction and I/I₀ of ASTM card.

TABLE 7B

Substrate: (100) oriented ZnS single crystal

| | Gas species | Flow rate (SCCM) | Discharging power (W) | Substrate temperature (°C.) | Inner pressure (Torr) | Light source | Film Forming rate (Å/S) |
|---|---|---|---|---|---|---|---|
| Activation space (A) | SiF₄ | 20 | 500 | 320 | 0.02 | Xe lamp 1 KW | 1.8 |
| Activation space (B) | H₂ | 50 | 200 | | | | |
| Etching conditions | F₂ | 15 | | | | | |

TABLE 8B

| | X-ray diffraction | | Crystal grain size | H content |
|---|---|---|---|---|
| | (400)/(220) | (400)/(111) | (μm) | (atomic %) |
| Example 1 | 1000 | 800 | 2.0 | 0.18 |

* In Table 8, (400)/(220) and (400)/(111) are peak intensity ratios reflecting the respective crystal faces by X-ray diffraction and I/Io of ASTM card.

TABLE 9B

Substrate: (111) oriented ZnS single crystal

| | Gas species | Flow rate (SCCM) | Discharging power (W) | Substrate temperature (°C.) | Inner pressure (Torr) | Light source | Film Forming rate (Å/S) |
|---|---|---|---|---|---|---|---|
| Activation space (A) | SiF₄ | 20 | 500 | 340 | 0.02 | Xe lamp 1 KW | 0.9 |
| Activation space (B) | H₂ | 50 | 200 | | | | |
| Etching conditions | F₂ | 18 | | | | | |

TABLE 10B

| | X-ray diffraction | | Crystal grain size | H content |
|---|---|---|---|---|
| | (111)/(220) | (111)/(400) | (μm) | (atomic %) |
| Example 1 | 500 | 600 | 2.2 | 0.22 |

* In Table 10, (111)/(220) and (111)/(400) are peak intensity ratios reflecting the respective crystal faces by X-ray diffraction and I/I₀ of ASTM card.

I claim:

1. A process for forming a silicon containing polycrystalline film on a substrate in a film forming space which comprises:
    (a) arranging said substrate having an exposed surface which has a crystal orientability with a specific face direction in said film forming space;
    (b) forming said silicon containing polycrystalline film on said exposed surface of said substrate by separately introducing into said film forming space an activated species (A) formed by decomposition of a compound (SX) containing silicon and halogen in a first activation space separate from said film forming space and an activated substance (B) formed in a second activation space separate from said film forming space from a chemical species (B) for film formation which is chemically mutually reactive with said activated species (A) to form a mixture and effect a chemical reaction therebetween to thereby effect the formation of the polycrystalline deposited film, said polycrystalline deposited film having a film growth surface; and
    (c) exposing the film growth surface of the polycrystalline deposited film to a gaseous substance (E) capable of effecting an etching action thereon and thereby effecting crystal growth in a specific face direction wherein said gaseous substance (E) is irradiated with light energy to enhance its activity.

2. A process for forming a deposited film according to claim 1, wherein said compound (SX) is a chain halogenated silicon represented by the formula $Si_uY_{2u+2}$ (wherein u is an integer of 1 or more, Y is at least one element selected from F, Cl, Br and I).

3. A process for forming a deposited film according to claim 1, wherein said compound (SX) is a chain or cyclic halogenated silicon represented by the formula $Si_uH_xY_y$ (wherein u, x, y are integers of 1 or more, x+y=2u or x+y=2u+2, and Y is at least one element selected from F, Cl, Br and I).

4. A process for forming a deposited film according to claim 1, wherein either one of hydrogen and halogen is used in addition to said compound (SX) during decomposition of said compound (SX).

5. A process for forming a deposited film according to claim 1, wherein said chemical substance (B) for film formation is either one of hydrogen gas and halogen gas.

6. A process for forming a deposited film according to claim 1, wherein the flow rate ratio of said active species (A) and said active species (B) when introduced into the film-forming space is 10:1 to 1:10.

7. A process for forming a deposited film according to claim 1, wherein a compound containing an impurity element as the component is permitted to coexist with said compound (SX) during formation of said activated species (A).

8. A process for forming a deposited film according to claim 1, wherein a compound containing an impurity element as the component is permitted to coexist with said chemical substance (B) for film formation during formation of said activated species (B).

9. A process for forming a deposited film according to claim 1, further comprising introducing into said film forming space an activated species (D) formed from a compound containing an impurity element component.

10. A process for forming a deposited film according to claim 1, wherein said gaseous substance (E) is formed from a gaseous substance (E2), said gaseous substance (E2) having been introduced into said film forming space.

* * * * *

UNITED STATES PATENT AND TRADEMARK OFFICE
CERTIFICATE OF CORRECTION

PATENT NO. : 5,439,844
DATED : August 8, 1995
INVENTOR(S) : AKIRA SAKAI

Page 1 of 2

It is certified that error appears in the above-identified patent and that said Letters Patent is hereby corrected as shown below:

COLUMN 3

Line 26, "2u+2). Specific" should read
--2u+2). ¶ Specific--.

COLUMN 5

Line 18, "to" (first occurrence) should be deleted.
Line 60, "fasify-" should read --gasify- --.

COLUMN 7

Line 9, "120." should read --220.--.
Line 17, "preferably" should read --preferably be--.
Line 28, "111" should read --211--.

COLUMN 15

Table 7B, "

| Light: source | Film Forming rate (Å/S) |
|---|---|
| Xe lamp 1 KW | 1.8 |

"

should read

--

| Light: source | Film Forming rate (Å/S) |
|---|---|
| Xe lamp 1 KW | 1.8 |

--.

UNITED STATES PATENT AND TRADEMARK OFFICE
CERTIFICATE OF CORRECTION

PATENT NO. : 5,439,844

DATED : August 8, 1995

INVENTOR(S) : AKIRA SAKAI

Page 2 of 2

It is certified that error appears in the above-identified patent and that said Letters Patent is hereby corrected as shown below:

<u>COLUMN 15</u> (continued)

Table 9B, "

| Light: source | Film Forming rate (Å/S) |
|---|---|
| Xe lamp 1 KW | 0.9 | should read

--

| Light: source | Film Forming rate (Å/S) |
|---|---|
| Xe lamp | |

Signed and Sealed this

Sixth Day of February, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,439,844
DATED : August 8, 1995
INVENTOR(S) : Akira Sakai

It is certified that error appears in the above-indentified patent and that said Letters Patent is hereby corrected as shown below:

COLUMN 15

Line 52, "silicon containing" should be deleted.
Line 53, "crystalline" should read
--crystalline silicon--.
Line 58, "silicon containing polycrystalline" should read
--polycrystalline silicon--.

Signed and Sealed this

Second Day of April, 1996

Attest:

BRUCE LEHMAN

Attesting Officer

Commissioner of Patents and Trademarks